(12) United States Patent
Nakao et al.

(10) Patent No.: US 7,352,116 B2
(45) Date of Patent: Apr. 1, 2008

(54) MULTILAYER CERAMIC SUBSTRATE, METHOD FOR MANUFACTURING THE SAME, AND PIEZOELECTRIC RESONATOR COMPONENT

(75) Inventors: Shuya Nakao, Higashiomi (JP); Takahiro Motokawa, Yasu (JP); Junya Ago, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/548,737

(22) Filed: Oct. 12, 2006

(65) Prior Publication Data
US 2007/0063623 A1 Mar. 22, 2007

Related U.S. Application Data

(63) Continuation of application No. PCT/JP2005/005702, filed on Mar. 28, 2005.

(30) Foreign Application Priority Data
Apr. 20, 2004 (JP) .............................. 2004-124117

(51) Int. Cl.
*H01L 41/08* (2006.01)
(52) U.S. Cl. ..................... 310/366; 310/328; 310/363
(58) Field of Classification Search ................ 310/320, 310/324, 366, 363, 364; 428/426–428
See application file for complete search history.

(56) References Cited

U.S. PATENT DOCUMENTS 6,215,229 B1 * 4/2001 Kuroda et al. .............. 310/366
6,306,511 B1 10/2001 Nakao et al.
6,373,169 B1 * 4/2002 Wajima ...................... 310/320
6,531,806 B1 * 3/2003 Daidai ........................ 310/344
6,538,361 B2 * 3/2003 Yoshida ..................... 310/320
2003/0128526 A1 7/2003 Sakai et al.

FOREIGN PATENT DOCUMENTS

| JP | 06-069651 A | 3/1994 |
|----|-------------|--------|
| JP | 2003-025157 A | 1/2000 |
| JP | 2000-173346 A | 6/2000 |
| JP | 2001-30419 A | 2/2001 |

(Continued)

OTHER PUBLICATIONS

International Search Report issued in the corresponding International Application No. PCT/JP2005/005702, mailed on Jul. 5, 2005.

*Primary Examiner*—Mark Budd
(74) *Attorney, Agent, or Firm*—Keating & Bennett, LLP

(57) ABSTRACT

A multilayer ceramic substrate includes a multilayer composite including a first material layer including glass, a second material layer including a ceramic, disposed in contact with the first material layer, and an internal electrode including an electroconductive material, disposed in contact with at least one of the first material layer and the second material layer. The first material layer is sintered, and is firmly bonded to the second material layer by diffusing or permeating a portion of the glass in the first material layer into the second material layer. The internal electrode includes a main portion and a lead-out portion extending from the main portion to a side surface of the multilayer composite, and the internal electrode includes a ceramic powder at least in the lead-out portion.

10 Claims, 11 Drawing Sheets

FOREIGN PATENT DOCUMENTS

| | | |
|---|---|---|
| JP | 2002-026528 A | 1/2002 |
| JP | 2002-299820 A | 10/2002 |
| JP | 2003-132733 A | 5/2003 |
| JP | 2003-133694 A | 5/2003 |
| JP | 2003-174261 A | 6/2003 |
| JP | 2003-197459 A | 7/2003 |
| JP | 2003-258398 A | 9/2003 |
| JP | 2003-338720 A | 11/2003 |
| JP | 2004-111728 A | 4/2004 |

* cited by examiner

MULTILAYER CERAMIC SUBSTRATE, METHOD FOR MANUFACTURING THE SAME, AND PIEZOELECTRIC RESONATOR COMPONENT

BACKGROUND OF THE INVENTION

1. Field of the Invention

The present invention relates to a multilayer ceramic substrate, a method for manufacturing the same, and a piezoelectric resonator component including the multilayer ceramic substrate, and more particularly, to an improvement of the material composition of the internal electrode included in the multilayer ceramic substrate.

2. Description of the Related Art

A multilayer ceramic substrate of interest to the invention has been disclosed in Japanese Unexamined Patent Application Publication 2001-30419 (Patent Document 1).

The multilayer ceramic substrate disclosed in Patent Document 1 is manufactured by a method including the steps of preparing a green composite including a base layer including, for example, a glass powder and a ceramic powder, a first functional material layer including a dielectric ceramic powder, and a second functional material layer including a magnetic ceramic powder, firing the green composite at a predetermined temperature to sinter at least a portion of the glass powder, and to allow a portion of the glass included in the base layer to diffuse or flow into the first and the second functional material layer, thereby fixing to each other the dielectric ceramic powder and the magnetic ceramic powder contained in the first and second functional material layers to each other without sintering.

This method enables firing at a relatively low temperature, and thus, achieves a multilayer ceramic substrate having superior specific electrical characteristics, such as a dielectric property, magnetism, resistance, and/or an insulating property.

The method of Patent Document 1 reduces the shrinkage of the base layer and the first and second functional material layers during firing.

The multilayer ceramic substrate includes internal electrodes disposed along the base layer and/or the functional material layers. If the internal electrodes are made of an electroconductive paste, they are sintered to shrink by firing. Consequently, a relatively high stress exists at the interface between the internal electrode and the base layer and/or the interface between the internal electrode and the functional material layer after the sintering.

In the manufacture of the multilayer ceramic substrate, in general, a mother composite is prepared through a firing step, and cut into a plurality of multilayer ceramic substrates with, for example, a dicer. By this cutting, ends of specific internal electrodes may be exposed at the cut surfaces.

However, the residual stress may cause the interface between the internal electrode and the base layer and/or the interface between the internal electrode and the functional material layer to crack when the mother composite is cut into multilayer ceramic substrates.

SUMMARY OF THE INVENTION

To overcome the problems described above, preferred embodiments of the present invention provide a multilayer ceramic substrate that reduces the residual stress after firing by including a ceramic powder in the internal electrode, a method for manufacturing the same, and a piezoelectric resonator component including the multilayer ceramic substrate.

More specifically, the multilayer ceramic substrate according to a preferred embodiment of the present invention includes a multilayer composite including a first material layer including glass, second material layer including a ceramic, disposed in contact with the first material layer, and an internal electrode including an electroconductive material, disposed in contact with the first material layer and/or the second material layer. The first material layer is sintered, and is securely bonded to the second material layer by diffusing or permeating a portion of the glass in the first material layer into the second material layer.

In this multilayer ceramic substrate, the internal electrode includes a main portion, and a lead-out portion extending from the main portion and to a side surface of the multilayer composite, and the internal electrode includes a ceramic powder in at least the lead-out portion.

The first material layer preferably further includes a ceramic. In this instance, the ceramic of the ceramic powder included in the internal electrode may be the same as the ceramic included in the first material layer, or as the ceramic included in the second material layer. If the first and the second material layer include the same ceramic, the ceramic of the ceramic powder included in the internal electrode may be the same as the ceramic included in the first and the second material layer.

Preferably, a portion of the glass included in the first material layer diffuses or permeates into the entirety of the second material layer.

Preferably, at least a portion of the glass has a melting point lower than the sintering temperature of the second material layer.

Preferably, the ceramic powder content in the internal electrode is in the range of about 30% to about 50% by volume of the electroconductive material in the portion including the ceramic powder of the internal electrode.

Preferably, the main portion of the internal electrode does not include the ceramic powder, and the lead-out portion includes the ceramic powder. In this instance, preferably, the ceramic powder is included in the lead-out portion from a side surface of the multilayer composite to about 0.05 mm inside.

The internal electrode may include a main layer arranged so as to define the main portion, and a lead-out layer arranged so as to overlap with the main layer and to define the lead-out portion. In this instance, the main layer does not include the ceramic powder and the lead-out layer includes the ceramic powder.

The multilayer ceramic substrate preferably further includes a second internal electrode opposing the internal electrode so as to define a capacitor.

Preferred embodiments of the present invention are also directed to a piezoelectric resonator component including a plate-like piezoelectric resonator element, and a first exterior substrate and a second exterior substrate separated in the vertical direction by the piezoelectric resonator element. In the piezoelectric resonator component, at least one of the first and second exterior substrates is defined by the multilayer ceramic substrate according to other preferred embodiments of the present invention.

Preferred embodiments of the present invention are also directed to a method for manufacturing a multilayer ceramic substrate.

The multilayer ceramic substrate manufacturing method according to a preferred embodiment of the present invention includes the green mother composite preparation step of preparing a green mother composite including a green first material layer including a glass material, a green second material layer including a ceramic material and disposed in contact with the first material layer, and a green internal electrode made of a electroconductive paste including an electroconductive material and disposed in contact with the first material layer and/or the second material layer.

The method also includes a firing step of firing the green mother composite at a temperature at which the first material layer is sintered while at least a portion of the glass material diffuses or permeates into the second material layer, thereby securely bonding the first material layer and the second material layer to each other to produce a sintered mother composite.

The method also includes a cutting step of cutting the sintered mother composite so as to expose the internal electrode at the cut surface, thereby yielding a multilayer ceramic substrate defined by a chip of the composite.

In the multilayer ceramic substrate manufacturing method, the electroconductive paste of the green internal electrode disposed in the green mother composite includes a ceramic powder at least in the vicinity of the cut surface formed in the cutting step.

Preferably, the firing step shrinks the internal electrode by less than about 19%.

Preferably, the ceramic powder content in the electroconductive paste for the internal electrode is in the range of about 30% to about 50% by volume of the electroconductive material, in the portion including the ceramic powder of the internal electrode.

In the multilayer ceramic substrate according to preferred embodiments of the present invention, the first material layer is sintered, and the first material layer and the second material layer are securely bonded to each other by diffusing or permeating a portion of the glass included in the first material layer into the second material layer. This means the firing temperature at which such a multilayer ceramic substrate is obtained is relatively low. Since the firing temperature is relatively low, the manufacturing cost is reduced. In addition, the second material layer prevents the first material layer from shrinking when it is sintered. Consequently, the resulting multilayer ceramic substrate has a high dimensional precision.

Since the internal electrode disposed in the multilayer ceramic substrate produced with the shrinkage prevented during firing includes a ceramic powder at least in the lead-out portion, the shrinkage of the internal electrode by sintering is reduced. Consequently, the residual stress resulting from the shrinkage of the internal electrode is reduced, such that cracks are prevented which are caused by release of the stress of the internal electrode in the lead-out portion exposed at the cut surface formed by cutting the mother composite into multilayer ceramic substrates.

In preferred embodiments of the present invention, a portion of the glass included in the first material layer is diffused or permeated into the entirety of the second material layer. By enabling all the particles of the second powder to adhere and fix to each other via the glass, the mechanical strength of the second material layer is improved. Since the first material layer includes glass and a portion of the glass is diffused or permeated into the entirety of the second material layer, the second material layer also includes the glass. Accordingly, the material layer in contact with the internal electrode necessarily includes the glass. The glass has good wettability to the ceramic powder included in the internal electrode, and accordingly, the adhesion strength between the internal electrode and the adjoining material layer is improved. This further prevents cracks from occurring.

In preferred embodiments of the present invention, by setting the melting point of at least a portion of the glass included in the first material layer at a temperature less than the sintering temperature of the second material layer, the ceramic included in the second material layer is more securely fixed with the glass included in the first material layer by firing, without being sintered.

As the ceramic powder content in the internal electrode is increased, the internal electrode is more effectively prevented from shrinking during firing, but the electrical continuity of the internal electrode is decreased. Therefore, the ceramic powder content in the internal electrode is preferably set in the range of about 30% to about 50% by volume of the electroconductive material in the portion including the ceramic powder of the internal electrode, such that high electrical continuity is ensured while the shrinkage is sufficiently prevented during firing.

Furthermore, by designing the internal electrode such that the main portion does not include the ceramic powder but the lead-out portion does, the thickness of the main portion of the internal electrode is easily reduced. This prevents air from being trapped between the material layers in the step of preparing a green mother composite in the manufacture process of the multilayer ceramic substrate. Accordingly, bores are not easily formed in the resulting multilayer ceramic substrate. Also, the electrical continuity of the main portion of the internal electrode is increased. In particular, when the ceramic powder is included in the lead-out portion from a side surface of the multilayer composite to about 0.05 mm inside, the above-described effects are more certainly and effectively produced.

The internal electrode may include a main layer arranged so as to define the main portion and a lead-out layer arranged so as to overlap with the main layer and to define the lead-out portion. This structure facilitates the formation of the main layer not including the ceramic powder and the lead-out layer including the ceramic powder.

If a second internal electrode is opposed to the internal electrode to define a capacitor, the area of the internal electrode relatively increases and the residual stress resulting from the shrinkage during firing tends to increase. Preferred embodiments of the present invention are remarkably effective in such a case.

The piezoelectric resonator component according to preferred embodiments of the present invention includes a first and a second exterior substrate separated in the vertical direction by a piezoelectric resonator element, and at least one of the first and second exterior substrates is defined by the multilayer ceramic substrate according to various preferred embodiments of the present invention. Thus, the piezoelectric resonator component has dimensional accuracy and a reduced cost.

In the method for manufacturing the multilayer ceramic substrate according to preferred embodiments of the present invention, by controlling the shrinkage of the internal electrode to less than about 19% in the firing step, the resulting multilayer ceramic substrate is not likely to crack.

In the ceramic substrate manufacturing method of preferred embodiments of the present invention, if the cutting step is performed with a dicer, the lead-out portion of the internal electrode is likely to crack. Preferred embodiments of the present invention are remarkably effective in such a case.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
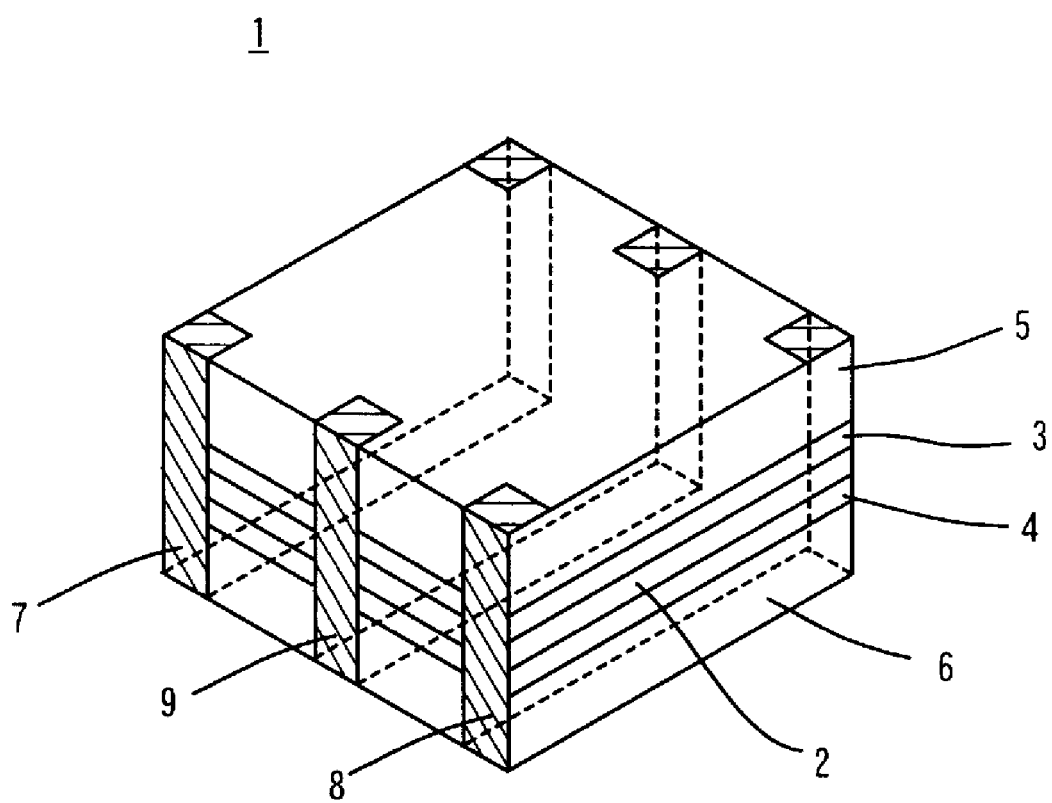
FIG. 1 is a perspective view of the appearance of a piezoelectric resonator component 1 according to a first preferred embodiment of the present invention.
Figure 2:
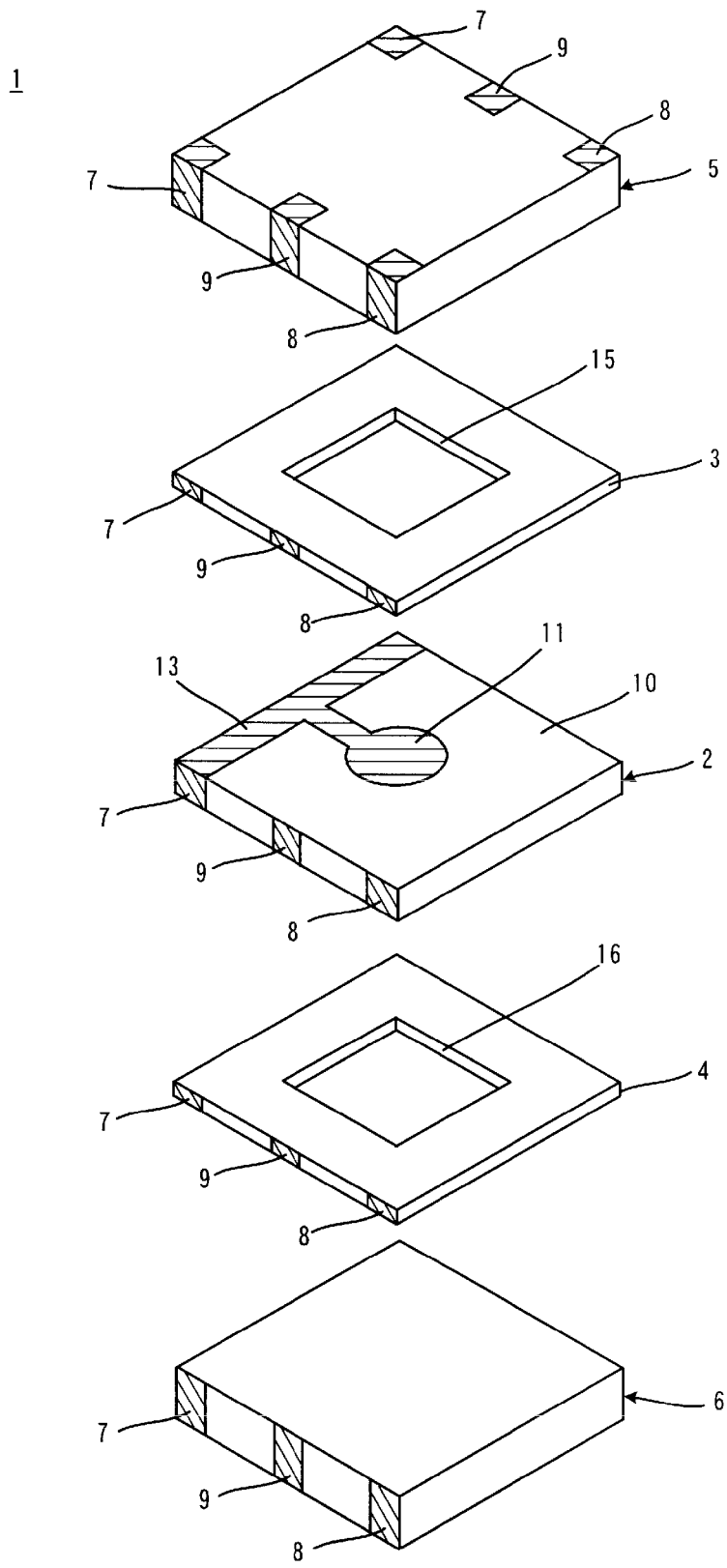
FIG. 2 is an exploded perspective view showing portions of the piezoelectric resonator component 1 shown in FIG. 1.
Figure 3:
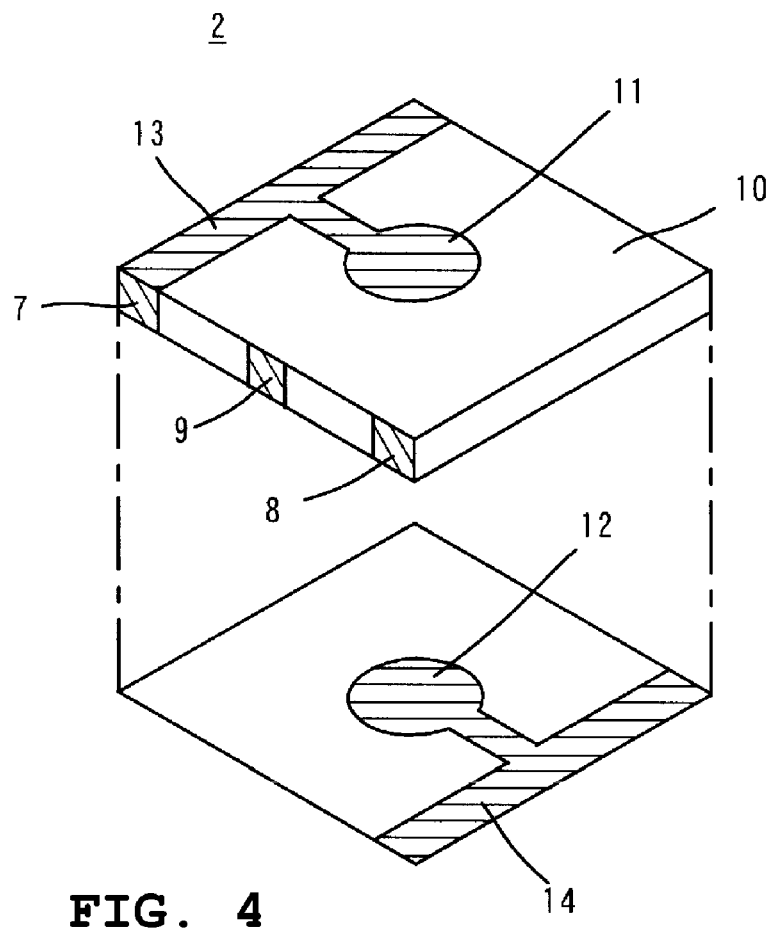
FIG. 3 is a complementary perspective view to FIG. 2 showing the shape of electrodes provided in the piezoelectric resonator element 2 shown in FIG. 2.
Figure 4:
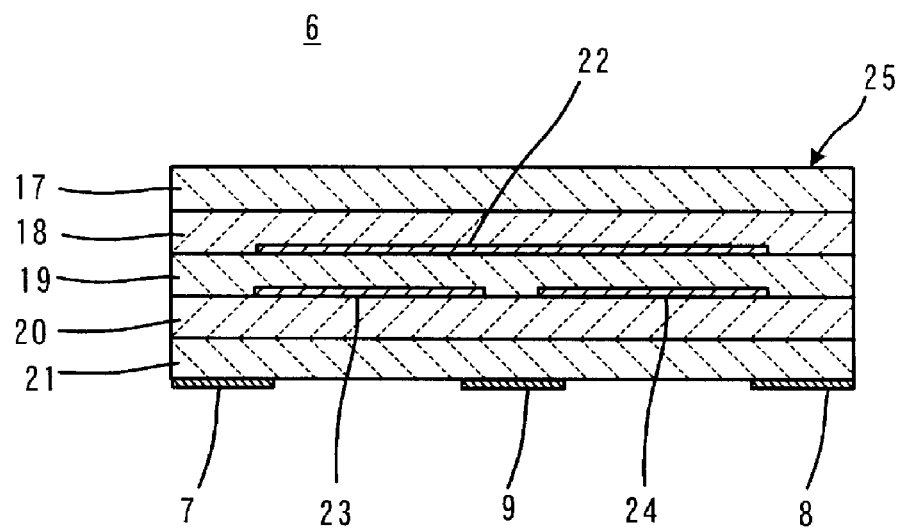
FIG. 4 is a sectional view of one substrate 6 of the exterior substrates shown in FIG. 2.
Figure 5A:
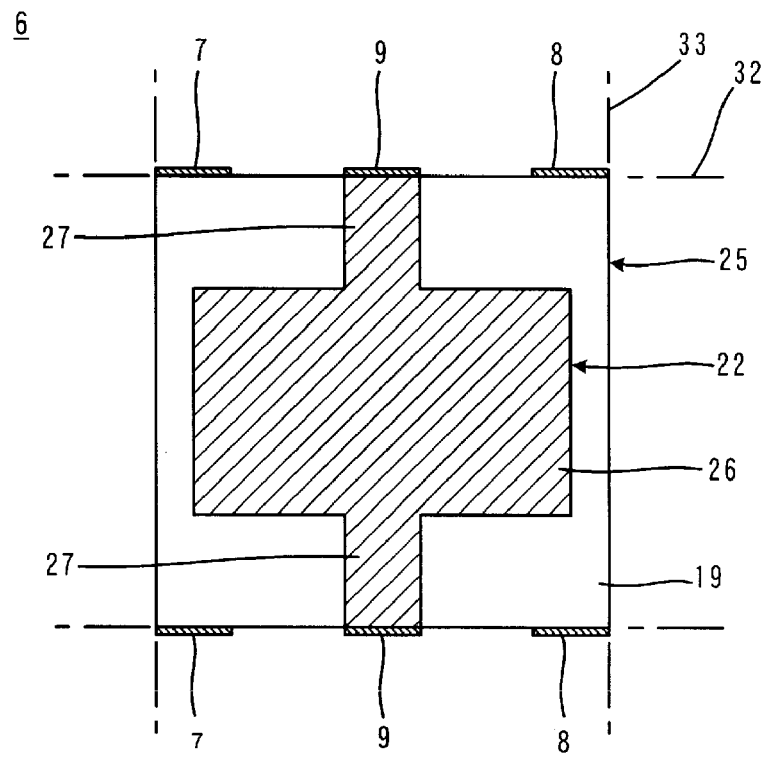
FIGS. 5A and 5B show plan views of the state in which the internal electrodes 22 to 24 are disposed in the exterior substrate 6 shown in FIG. 4.
Figure 5B:
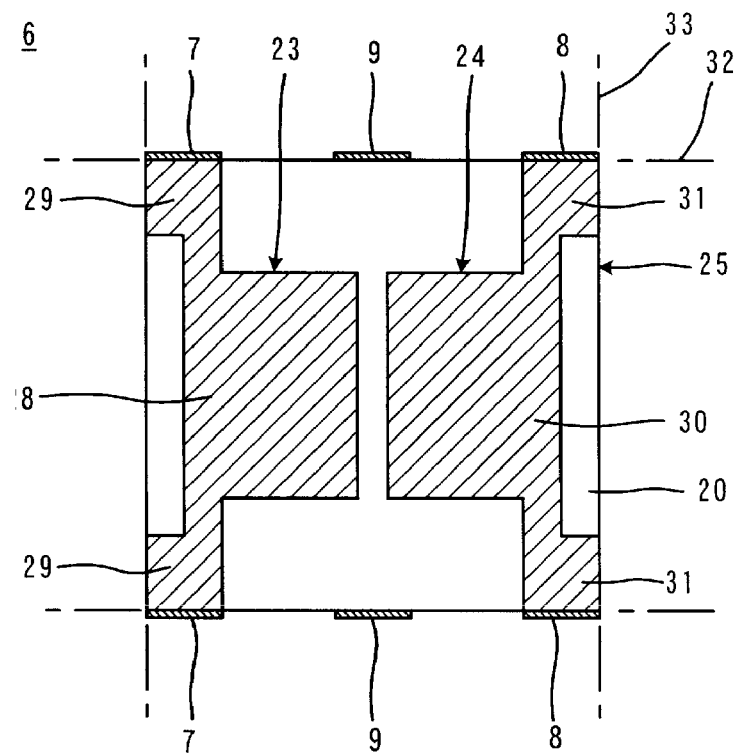

FIGS. 1 to 5B are representations of a first preferred embodiment of the present invention. FIG. 1 is a perspective view of the appearance of a piezoelectric resonator component 1. FIG. 2 is an exploded perspective view showing portions of the piezoelectric resonator component 1 shown in FIG. 1. FIG. 3 is a complementary perspective view to FIG. 2, showing the shape of electrodes provided in the piezoelectric resonator element 2 shown in FIG. 2. FIG. 4 is a sectional view of one substrate 6 of the exterior substrates shown in FIG. 2. FIGS. 5A and 5B show plan views of the state where the internal electrodes 22 to 24 are disposed in the exterior substrate 6 shown in FIG. 4.

The piezoelectric resonator component 1 includes a plate-like piezoelectric resonator element 2, a first exterior substrate 5, and a second exterior substrate 6 disposed over and under the piezoelectric resonator element 2, each having an adhesive layer 3 or 4 in between.

The piezoelectric resonator component 1 includes terminal electrodes 7, 8, and 9 disposed on the external surface. The terminal electrodes 7 to 9 of the piezoelectric resonator component 1 are each disposed to extend from one region to another of the upper surface of a composite including the piezoelectric resonator element 2, the adhesive layers 3 and 4, and the exterior substrates 5 and 6 across a pair of opposing side surfaces and the bottom surface of the composite.

The terminal electrodes 7 to 9 can be formed by applying and burning an electroconductive paste. Alternatively, the terminal electrodes 7 to 9 may be formed by thin film deposition, such as sputtering.

The piezoelectric resonator element 2 preferably includes a substantially rectangular piezoelectric plate 10. The piezoelectric plate 10 is made of, for example, a piezoelectric ceramic. FIG. 3 shows the piezoelectric plate 10 separately in a perspective view, and a projection of the electrode disposed on the lower surface of the piezoelectric plate 10 is shown at the bottom of the figure.

One excitation electrode 11 is disposed in the middle of the upper surface of the piezoelectric plate 10, and the other excitation electrode 12 is disposed in the middle of the lower surface of piezoelectric plate 10 in the same manner. These excitation electrodes 11 and 12 oppose each other with the piezoelectric plate 10 disposed therebetween.

The excitation electrode 11 is connected to a lead-out electrode 13 provided on the upper surface of the piezoelectric plate 10 along one of two opposing sides. The lead-out electrode 13 extends to both ends of the piezoelectric plate 10 to be electrically connected to the terminal electrode 7.

The other excitation electrode 12 is connected to a lead-out electrode 14 formed on the lower surface of the piezoelectric plate 10 along the other side. The lead-out electrode 14 extends to both ends of the piezoelectric plate 10 to be electrically connected to the terminal electrode 8.

The piezoelectric resonator element 2 is preferably an energy-trap type, and the region where the excitation electrodes 11 and 12 oppose each other defines a vibrating region. The adhesive layers 3 and 4 have substantially rectangular openings 15 and 16, respectively, to provide spaces for enabling the vibration in the vibrating region.

The first and second exterior substrates 5 and 6 each include the multilayer ceramic substrate according to a preferred embodiment of the present invention.

The second exterior substrate 6 will now be described. The exterior substrate 6 includes a multilayer composite 25 including a plurality of material layers 17 to 21 and internal electrodes 22 to 24, each in contact with specific ones of the material layers 17 to 21, as shown in FIG. 4.

Two material layers 18 and 20 of the material layers 17 to 21 each define a first material layer including glass, and the other material layers 17, 19, and 21 each define a second material layer disposed in contact with the first material layer 18 or 20 and including a ceramic. In the present preferred embodiment, the first material layers 18 and 20 and the second material layers 17, 19, and 21 are alternately stacked on each other, and the second material layers 17 and 21 are disposed as the outermost layers.

The internal electrodes 22 to 24 are disposed in the exterior substrate 6 so as to define a 3-terminal capacitor. The horizontal section through the internal electrode 22 is shown in FIG. 5A, and the horizontal section through the internal electrodes 23 and 24 is shown in FIG. 5B.

The first internal electrode 22 includes a main portion 26 and lead-out portions 27 extending from the main portion 26 to side surfaces of the multilayer composite 25. The second internal electrode 23 includes a main portion 28 and lead-out portions 29 extending from the main portion 28 to a side surface of the multilayer composite 25. The third internal electrode 24 includes a main portion 30 and lead-out portions 31 extending from the main portion 30 to a side surface of the multilayer composite 25.

The first internal electrode 22 is opposed to the second and third internal electrodes 23 and 24 with the second material layer 19 therebetween, thereby defining a capacitor between the first internal electrode and the second and third internal electrodes.

The lead-out portions 27 of the first internal electrode 22 are electrically connected to the terminal electrode 9. The lead-out portions 29 of the second internal electrode 23 are electrically connected to the terminal electrode 7. The lead-out portions 31 of the third internal electrode 24 are electrically connected to the terminal electrode 8.

Thus, a three-terminal capacitor is defined which is connected to the terminal electrodes 7 to 9. As described above, the terminal electrodes 7 and 8 are electrically connected to the excitation electrode 11 and 12, respectively. Thus, a load capacitance-containing three-terminal piezoelectric oscillator is obtained by using the terminal electrodes 7 and 8 as input/output terminals, and the terminal electrode 9 as a grounding terminal.

The first exterior substrate 5 may also have substantially the same structure as the second exterior substrate 6.

For the production of the second exterior substrate 6, green sheets for the first material layers 18 and 20 and green sheets for the second material layers 17, 19, and 21 are prepared. The green sheets for the material layers 19 and 20 are respectively provided with an unfired internal electrode 22 and unfired internal electrodes 23 and 24 on their surfaces. The unfired internal electrodes are made of an electroconductive paste.

The green sheets for the first material layers 18 and 20 include a glass powder, and preferably, further include a ceramic powder.

The glass material of the glass powder may include a component that is melted to vitrify by firing. An anorthite-based crystallized glass may be advantageously used as the glass material. In addition, borosilicate glass, cordierite-based crystallized glass, or other suitable materials may be used.

Alumina can be used as the material of the ceramic powder included in the green sheets for the first material layers 18 and 20.

In order to obtain a green sheet including the glass powder and the ceramic powder, the glass powder and the ceramic powder are mixed with a dispersing medium and a binder, for example, to prepare a slurry. The slurry is formed into a green sheet by, for example, the doctor blade method.

Examples of the dispersing medium include water, toluene, alcohols, and mixtures thereof. Examples of the binder include butyral resin, acrylic resin, urethane resin, vinyl acetate resin, and polyvinyl alcohols.

The slurry may include a plasticizer, a dispersant, an antifoaming agent, and other addictives, if necessary.

The green sheets for the second material layers 17, 19, and 21 include a ceramic powder.

This ceramic powder includes a ceramic material having specific electrical characteristics, such as a dielectric property, magnetism, resistance, or an insulating property. In the present preferred embodiment, the green sheet intended for the material layer 19 disposed between the opposing internal electrodes 22 and 23 and 24 includes a dielectric ceramic powder, such as barium titanate-based ceramic powder. The green sheets for the material layers 17 and 21 do not require dielectric properties, and include a highly insulating ceramic powder, such as alumina powder.

The second material layers 17, 19, and 21 each include a ceramic powder according to the electrical characteristics desired.

A dispersing medium and a binder are added to the ceramic powder to prepare a slurry. The slurry is formed into a green sheet by the doctor blade method.

The binder and the disperse medium included in the slurry for the second material layers 17, 19, and 21 may be the same as or different from those of the slurry for the first material layers 18 and 20.

The electroconductive paste for forming the internal electrodes 22 to 24 includes an electroconductive metal powder, a binder, and a solvent, and further includes a ceramic powder. The ceramic powder content is preferably set in the range of about 30% to about 50% by volume of the electroconductive metal powder as an electroconductive material.

Alumina can be advantageously used as the material of the ceramic powder. Alternatively, cordierite, titania, zirconia, or the like may be used.

The electroconductive paste is applied onto each of the green sheets for the material layers 19 and 20 by screen printing, for example, so as to form the green internal electrodes 22 to 24.

Subsequently, the green sheets for the material layers 17 to 21 are stacked one on top of another so as to form the sectional structure as shown in FIG. 4 and the stack of the green sheets is pressed in the stacking direction.

Thus, the green multilayer composite 25 is prepared. In the above-described process, the multilayer composite is prepared as a mother composite that will be cut into a plurality of multilayer composites 25 in a subsequent cutting step. For the sake of understanding this easily, FIGS. 5A and 5B show dotted-chain lines that indicate a portion of the cut surfaces 32 and 33 formed in the cutting step.

Then, the green mother composite for the plurality of multilayer composites 25 is fired at a predetermined temperature.

This firing step is performed at a temperature at which at least a portion of the glass included in the first material layers 18 and 20 is melted while the first material layers 18 and 20 are sintered. Consequently, the binder included in the material layers 17 to 21 is removed, at least a portion of the glass included in the first material layers 18 and 20 is melted, and the first material layers 18 and 20 are sintered, through the firing step.

At the same time, a portion of the molten glass prepared by melting the glass powder in the first material layers 18 and 20 is allowed to diffuse or flow, or typically permeate, into the second material layers 17, 19, and 21 by the capillary action. The permeated glass fills the interstices of the ceramic powder and enables the particles of the ceramic powder to adhere and fix to each other, thus bonding the first material layers 18 and 20 and the second material layers 17, 19, and 21 to one another.

Preferably, the glass material included in the first material layers 18 and 20 partially diffuses or flows into the entirety of the second material layers 17, 19, and 21 such that the entire ceramic powder included in the second material layers 17, 19, and 21 is fixed with the glass material. Thus, the mechanical strength of the second material layers 17, 19, and 21 is enhanced.

As the particle size of the ceramic powder in the second material layers 17, 19, and 21 is reduced, the capillary action causing the glass to flow viscously increases, and thus, the density of the glass is easily increased.

In order to ensure that cracks are prevented in the firing step, the shrinkage of the internal electrodes 22 to 24 is preferably less than about 19%. The shrinkage can be controlled by the content of the ceramic powder in the electroconductive paste for forming the internal electrodes 22 to 24. It has been confirmed by an experiment described below that when the ceramic powder content is in the range of about 30% to about 50% by volume of the electroconductive material, the shrinkage of the internal electrodes 22 to 24 is reduced to less than about 19%.

The shrinkage of the internal electrodes 22 to 24 depends on the type of the electroconductive material included in the electroconductive paste. For example, to ensure that an electroconductive paste including Ag or a Ag—Pd alloy as the electroconductive material provides internal electrodes 22 to 24 having sufficiently low resistance, the Ag:Pd weight ratio is preferably in the range of about 100:0 to about 70:30. However, as the Ag content in the electroconductive paste is increased, the shrinkage during firing is increased. In a severe case, the internal electrodes 22 to 24 may be broken. In order to reduce the shrinkage of the internal electrodes 22 to 24, it is preferable that the Pd content be increased while the thickness of the internal electrodes 22 to 24 is increased according to the increase of their resistance.

The second material layers 17, 19, and 21 are not substantially shrunk in the firing step because the ceramic powder included in the second material layers 17, 19, 21 is not sintered by the firing step. Accordingly, the first material layers 18 and 20 in contact with the second material layers 17, 19, and 21 are prevented from shrinking in the main surface direction. Consequently, the dimensional accuracy of the mother composite is improved.

In the firing step, the ceramic powder included in the second material layers 17, 19, and 21 may, at least partially, be sintered.

The fired mother composite is cut into a plurality of multilayer composites 25. As described above, the cut surfaces 32 and 33 formed in this cutting step are partially shown in FIGS. 5A and 5B. As shown in FIGS. 5A and 5B, the internal electrodes 22 to 24 are exposed at the cut surfaces 32 and/or 33 by this cutting step. More specifically, the lead-out portions 27 of the internal electrode 22 are exposed at the cut surfaces 32, and the lead-out portions 29 and 31 of the internal electrodes 23 and 24 are exposed at the cut surfaces 32 and 33. The cutting step is preferably performed with a dicer.

Since the internal electrodes 22 to 24 include a ceramic powder, as described above, their shrinkage resulting from sintering in the firing step is reduced. Accordingly, the residual stress caused by the shrinkage of the internal electrodes 22 to 24 is reduced. Consequently, cracks are prevented which are caused by release of the stress in the lead-out portions 27, 29, and 31 of the external electrodes 22 to 24 exposed at the cut surfaces 32 and/or 33 formed by cutting the mother composite.

Although not described specifically, the first exterior substrate 5 can be prepared in substantially the same manner as the second exterior substrate 6, if the first exterior substrate 5 includes a multilayer composite having substantially the same structure as the multilayer composite 25 of the second exterior substrate 6.

Figure 6A:
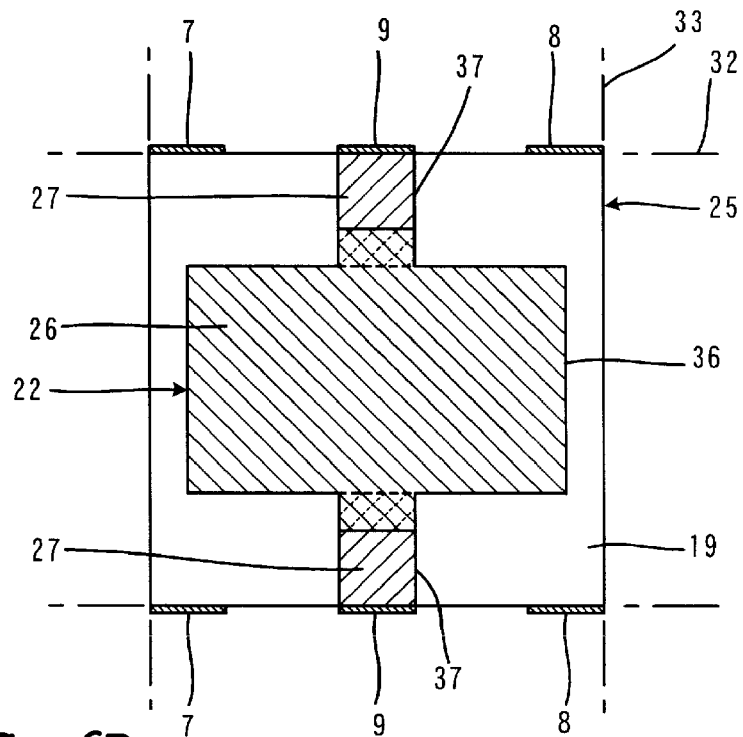
FIGS. 6A and 6B show representations of a second preferred embodiment of the present invention, corresponding to FIGS. 5A and 5B.
Figure 6B:
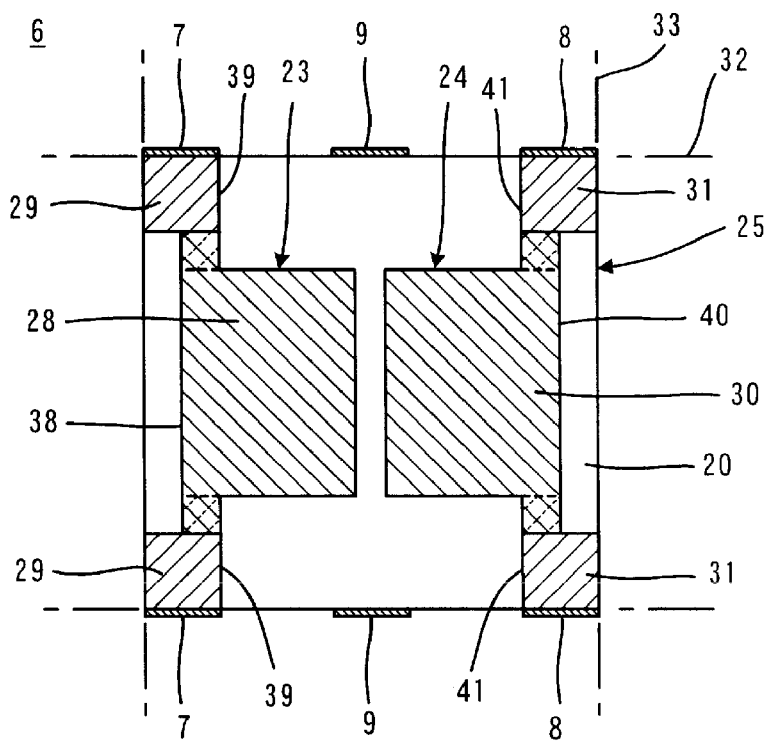

FIGS. 6A and 6B is a representation of a second preferred embodiment of the present invention, corresponding to FIGS. 5A and 5B. The elements in FIGS. 6A and 6B corresponding to those shown in FIGS. 5A and 5B are designated by the same reference numerals and the description thereof is not repeated.

In the second preferred embodiment, the internal electrodes 22 to 24 include main portions 26, 28, and 30 including no ceramic powder and lead-out portions 27, 29, and 31 including a ceramic powder.

More specifically, the internal electrode 22 includes a main layer 36 arranged so as to define the main portion 26, and a lead-out layer 37 arranged so as to overlap the main layer 36 and to define the lead-out portions 27. In the same manner, the internal electrode 23 includes a main layer 38 arranged so as to define the main portion 28, and a lead-out layer 39 arranged so as to overlap the main layer 38 and to define the lead-out portions 29. Also, the internal electrode 24 includes a main layer 40 arranged so as to define the main portion 30, and a lead-out layer 41 arranged so as to overlap the main layer 40 and to define the lead-out portions 31.

While the main layers 36, 38, and 40 include no ceramic powder, the lead-out layers 37, 39, and 41 include a ceramic powder.

The present preferred embodiment is based on the idea that in order to prevent cracks caused in the lead-out portions 27, 29, and 31 exposed at the cut surfaces 32 and/or 33 by release of the stress in the internal electrodes 22 to 24, it suffices to reduce the residual stress produced by shrinkage of the internal electrodes 22 to 24 in the firing step only in the vicinities of the cut surfaces 32 and 33, that is, only at the lead-out portions 27, 29, and 31.

Where only the lead-out layers 37, 39, and 41 include the ceramic powder as in the present preferred embodiment, the ceramic powder content in the electroconductive paste for forming the lead-out layers 37, 39, and 41 is preferably in the range of about 30% to about 50% by volume of the electroconductive material, and the shrinkage of the lead-out layers 37, 39, and 41 in the firing step is preferably less than about 19%.

According to the second preferred embodiment, the thickness of the main portions 26, 28, and 30 of the internal electrodes 22 to 24 can be easily reduced. Accordingly, air is not easily trapped between the material layers 18 to 20 in the step of preparing the green mother composite, and pores are not easily produced in the resulting exterior substrate 6. Furthermore, the main portions 26, 28, and 30 of the internal electrodes 22 to 24 exhibit higher electrical continuity.

As for the thickness of the internal electrodes 22 to 24, it is preferable that the lead-out layers 37, 39, and 41 have at thickness of about 1.4 µm to about 3.0 µm while the main layers 36, 38, and 40 have a thickness of about 0.6 µm to about 1.7 µm. If these thicknesses are reduced to less than the lower limits, the internal electrodes 22 to 24 are likely to break. If the thicknesses are increased to more than the upper limits, the exterior substrate 6 has a relatively large step.

The width of the overlap of the main layers 36, 38, and 40 with the respective lead-out layers 37, 39, and 41 is preferably at least about 0.195 mm. If the width of the overlap is less than about 0.195 mm, the internal electrodes 22 to 24 are likely to break.

Although FIGS. 6A and 6B show the main layers 36, 38, and 40 overlying the lead-out layers 37, 39, and 41, respectively, at the overlaps, the main layers may underlie the lead-out layers.

When the internal electrodes 22 to 24 include the ceramic powder only in the lead-out portions 27, 29, and 31, as in the second preferred embodiment, the ceramic powder is included only in the regions of the lead-out portions 27, 29, and 31 from the side surfaces of the multilayer composite to about 0.05 mm inside in order to effectively prevent cracks.

Figure 7:
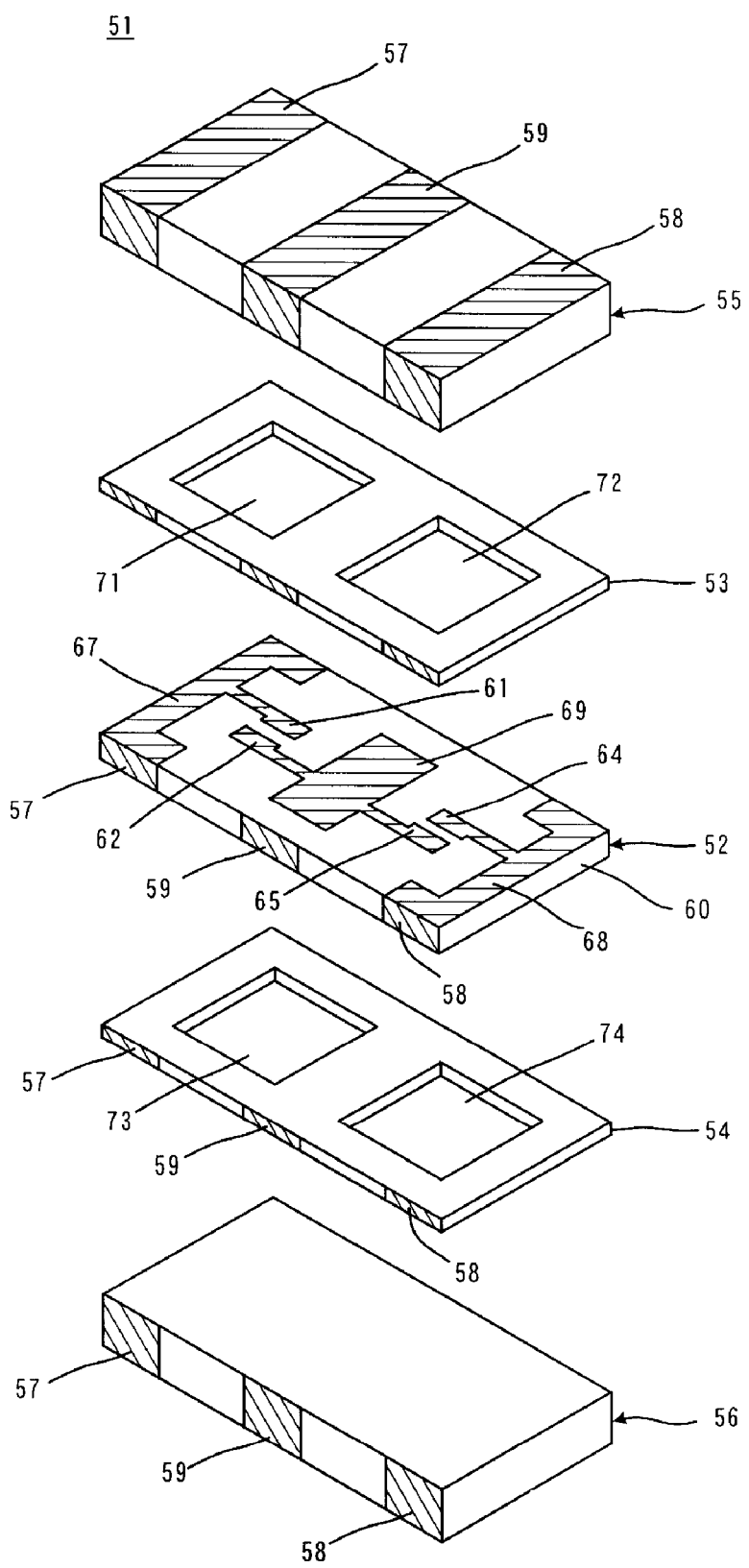
FIG. 7 is an exploded perspective view showing portions of a piezoelectric resonator component 51 according to a third preferred embodiment of the present invention.
Figure 8:
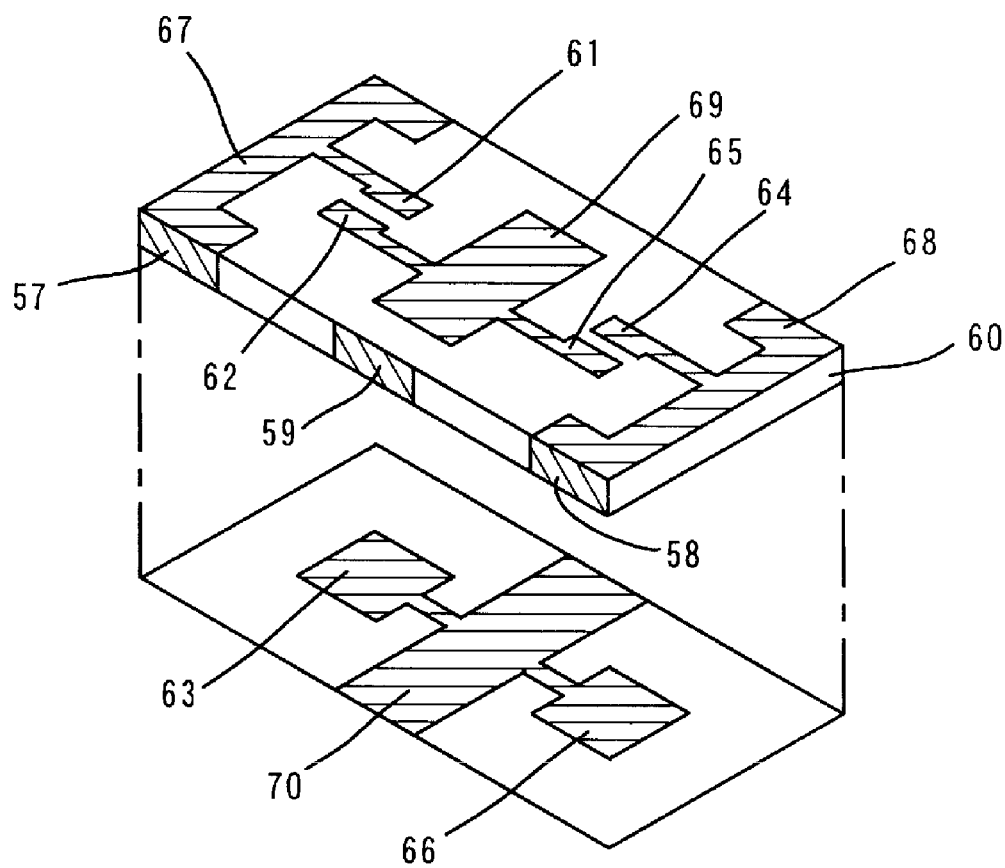
FIG. 8 is a complementary perspective view to FIG. 7 showing the shapes of electrodes formed in the piezoelectric resonator element 52 shown in FIG. 7.

FIGS. 7 and 8 are representations of a third preferred embodiment of the present invention. FIG. 7 is an exploded perspective of portions of a piezoelectric resonator component 51, corresponding to FIG. 2. FIG. 8 is a complementary perspective view to FIG. 7 showing the shape of electrodes provided in a piezoelectric resonator element 52 shown in FIG. 7.

The piezoelectric resonator component 51 includes a plate-like piezoelectric resonator element 52, and a first exterior substrate 55 and a second exterior substrate 56 disposed over and under the piezoelectric resonator element 52, each having an adhesive layer 53 or 54 therebetween, in a similar manner to the piezoelectric resonator component 1 shown in FIG. 2.

The piezoelectric resonator component 51 has terminal electrodes 57, 58, and 59 on the external surface. The terminal electrodes 57 to 59 are each disposed around the external surfaces of the piezoelectric resonator component 51. In the piezoelectric resonator component 51, the terminal electrodes 57 and 58 define input/output terminals, and the terminal electrode 59 defines a grounding terminal.

The piezoelectric resonator element 52 is preferably for an energy-trap piezoelectric filter device, and includes a substantially rectangular piezoelectric plate 60 made of a piezoelectric ceramic. FIG. 8 shows the piezoelectric plate 60 separately in a perspective view, and a projection of the electrode disposed on the lower surface of the piezoelectric plate 60 is shown at the bottom of the figure.

The piezoelectric resonator element 52 includes first and second filters and an intermediate capacitor.

The first filter is defined by a pair of resonance electrodes 61 and 62 on the upper surface of the piezoelectric plate 60, and a common electrode 63 opposing both resonance electrodes 61 and 62 on the lower surface of the piezoelectric plate 60. In the same manner, the second filter is defined by a pair of resonance electrodes 64 and 65 on the upper surface of the piezoelectric plate 60, and a common electrode 66 on the lower surface.

The resonance electrode 61 is connected to a lead-out electrode 67 disposed on the upper surface of the piezoelectric plate 60 along one of its ends. The lead-out electrode 67 extends to both sides of the piezoelectric plate 60 and is electrically connected to the terminal electrode 57.

The other resonance electrode 64 is connected to another lead-out electrode 68 on the upper surface of the piezoelectric plate 60 along the other end. The lead-out electrode 68 extends to both sides of the piezoelectric plate 60 and is electrically connected to the terminal electrode 58.

One capacitor electrode 69 is disposed in the middle of the upper surface of the piezoelectric plate 60, and the other capacitor electrode 70 opposing the capacitor electrode 69 is disposed in the middle of the lower surface. The capacitor electrode 70 extends to both sides of the piezoelectric plate 60 to be electrically connected to the terminal electrode 59.

The pair of capacitor electrodes 69 and 70 defines a capacitor which functions as the intermediate capacitor. The capacitor electrode 69 is connected to the resonance electrodes 62 and 65. The other capacitor electrode 70 is connected to the common electrodes 63 and 66.

The piezoelectric resonator element 52 has vibrating regions in the region where the resonance electrodes 61 and 62 oppose the common electrode 63 and the region where the resonance electrodes 64 and 65 oppose the common electrode 66. The adhesive layers 53 and 54 have openings, for example, substantially rectangular openings 71 and 72 or 73 and 74 to provide spaces for enable the vibration in the two vibrating regions.

The first and second exterior substrates 55 and 56 each include the multilayer ceramic substrate according to a preferred embodiment of the present invention, but are not detailed in the figures or the description.

The exterior substrates 55 and 56 may include capacitors in addition to the capacitor defined between the capacitor electrodes 69 and 70 of the piezoelectric plate 60, or only the exterior substrates 55 and 56 may include capacitors without providing the capacitor electrode 69 and 70 on the piezoelectric plate 60.

Figure 9:
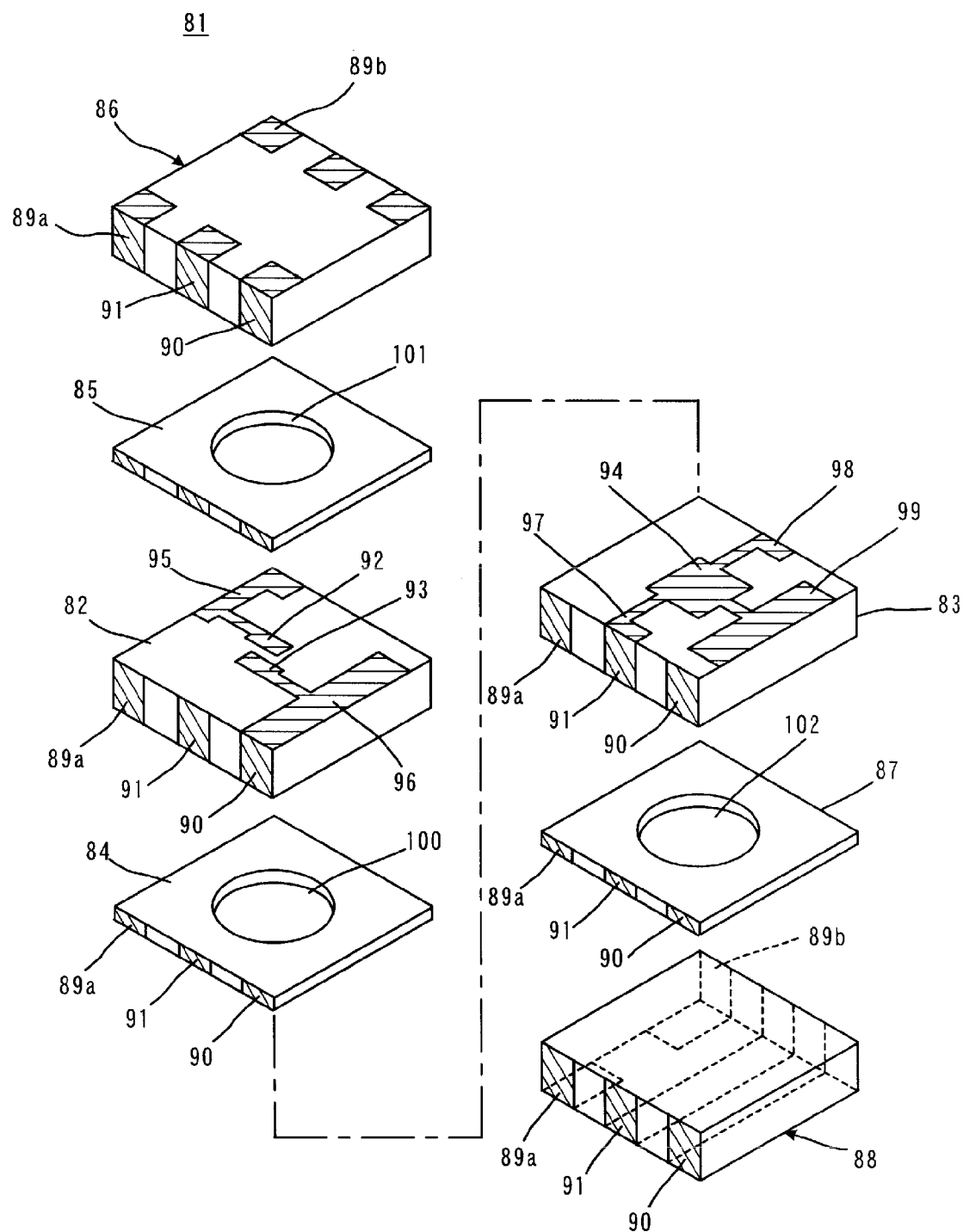
FIG. 9 is an exploded perspective view showing portions of a piezoelectric resonator component 81 according to a fourth preferred embodiment of the present invention.
Figure 10:
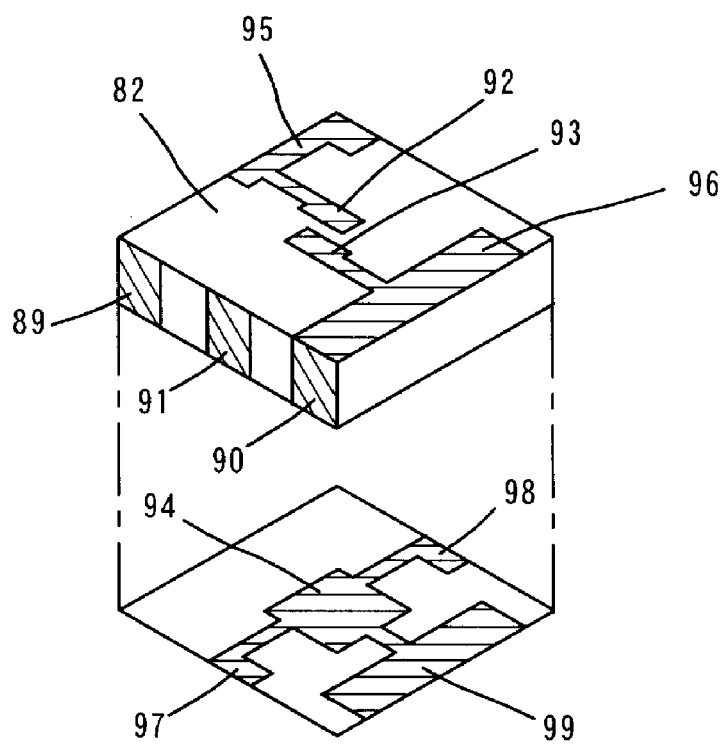
FIG. 10 is a complementary perspective view to FIG. 9 showing the shapes of electrodes formed in a piezoelectric plate 82 shown in FIG. 9.

FIGS. 9 and 10 are representations of a fourth preferred embodiment of the present invention. FIG. 9 is an exploded perspective view of the portions of a piezoelectric resonator component 81, corresponding to FIGS. 2 and 7. FIG. 10 is a perspective view of the shape of electrodes arranged on one piezoelectric plate 82 shown in FIG. 9, corresponding to FIGS. 3 and 8.

The piezoelectric resonator element 81 includes a first piezoelectric plate 82 and a second piezoelectric plate 83 bonded with an adhesive layer 84. The piezoelectric resonator component 81 also includes a first exterior substrate 86 bonded to the first piezoelectric plate 82 with an adhesive layer 85 therebetween, and a second exterior substrate 88 bonded to the second piezoelectric plate 83 with an adhesive layer 87 therebetween. The piezoelectric resonator component 81 includes terminal electrodes 89a, 89b, 90, and 91 on the external surfaces. The terminal electrodes 89a and 89b are electrically isolated, and each extends on the piezoelectric resonator component 81 from a region of the upper surface to a region of the lower surface across one of two opposing side surfaces. The terminal electrodes 90 and 91 each extend on the piezoelectric resonator component 81 from a region of the upper surface to a region of the lower surface across the two opposing side surfaces.

In the third preferred embodiment, the single piezoelectric plate 60 includes the first and the second filter and the intermediate capacitor. On the other hand, in the fourth preferred embodiment, the first piezoelectric plate 82 includes the first filter, the second piezoelectric plate 83 includes the second filter, and the first and second piezoelectric plates 82 and 83 include the respective intermediate capacitor.

A pair of resonance electrodes 92 and 93 is arranged in the middle of the upper surface of the first piezoelectric plate 82, and a common electrode 94 opposing the resonance electrodes 92 and 93 is arranged on the lower surface of the first piezoelectric plate 82.

One resonance electrode 92 is connected to a lead-out electrode 95, and the lead-out electrode 95 is electrically connected to the terminal electrode 89b. The other resonance electrode 93 is connected to a lead-out electrode 96, and the lead-out electrode 96 is electrically connected to the terminal electrode 90. The lead-out electrode 96 has an area so as to function as a capacitor electrode, in addition to a lead-out electrode.

The common electrode 94 is connected to lead-out electrodes 97 and 98 and a capacitor electrode 99. The lead-out electrodes 97 and 98 are electrically connected to the terminal electrode 91. The capacitor electrode 99 has a relatively large area and opposes the lead-out electrode 96 so as to function as a capacitor electrode.

The second piezoelectric plate 83 is arranged inversely to the first piezoelectric plate 82, but has substantially the same structure. Thus, the second piezoelectric plate 83 is provided with substantially the same electrodes as the first piezoelectric plate 82. As shown in FIG. 9, some of the electrodes on the second piezoelectric plate 83 are the same as those of the first piezoelectric plate 82 and are designated by the same reference numerals, and the description is not repeated. However, the lead-out electrode 95 of the second piezoelectric plate 83 is electrically connected to the terminal electrode 89a.

The first and second piezoelectric plates 82 and 83 each include a vibrating region in the region where the resonance electrodes 92 and 93 oppose the common electrode 94. The adhesive layers 84, 85, and 87 have openings, for example, substantially circular openings 100, 101, and 102, respectively, to provide spaces for enabling the vibration in the vibrating region.

The first and second exterior substrates 86 and 88 each include the multilayer ceramic substrate according to a preferred embodiment of the present invention, but are not detailed in the figures or the description.

The exterior substrates 86 and 88 may include capacitors in addition to the capacitor defined between the lead-out electrode 96 and the capacitor electrode 99 of the first and second piezoelectric plates 82 and 83, or only the exterior substrates 86 and 88 may include capacitors without providing the lead-out electrode 96 or capacitor electrode 99 to the first and second piezoelectric plates 82 and 83.

Experimental Examples will now be described which were conducted to confirm the effects of the present invention.

1. EXPERIMENTAL EXAMPLE 1

Figure 11:
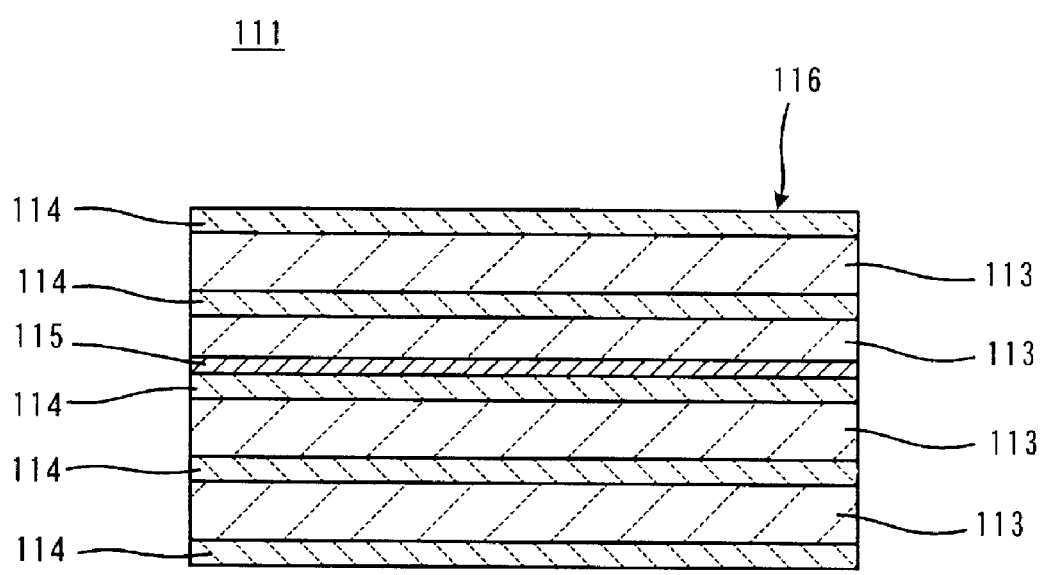
FIG. 11 is a sectional view of a multilayer ceramic substrate 111 prepared as a sample in Experimental Example 1 performed to confirm the effects of various preferred embodiments of the present invention.
Figure 12:
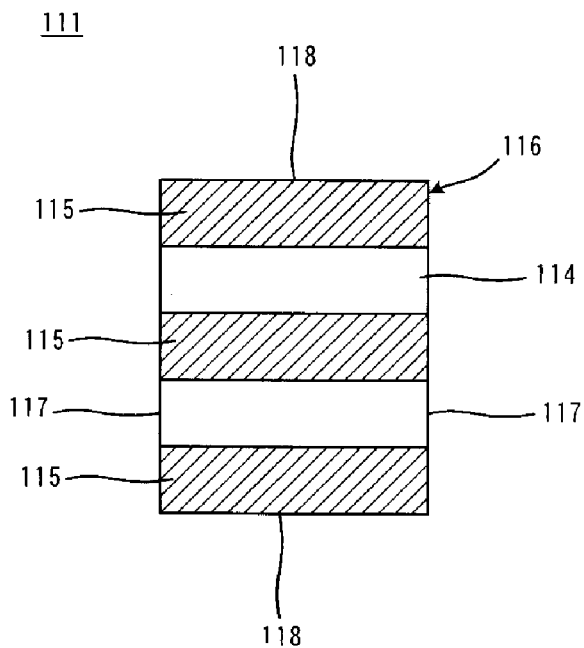
FIG. 12 is a plan view of the state where the internal electrodes 115 are disposed in the multilayer ceramic substrate 111 shown in FIG. 11.
Figure 13:
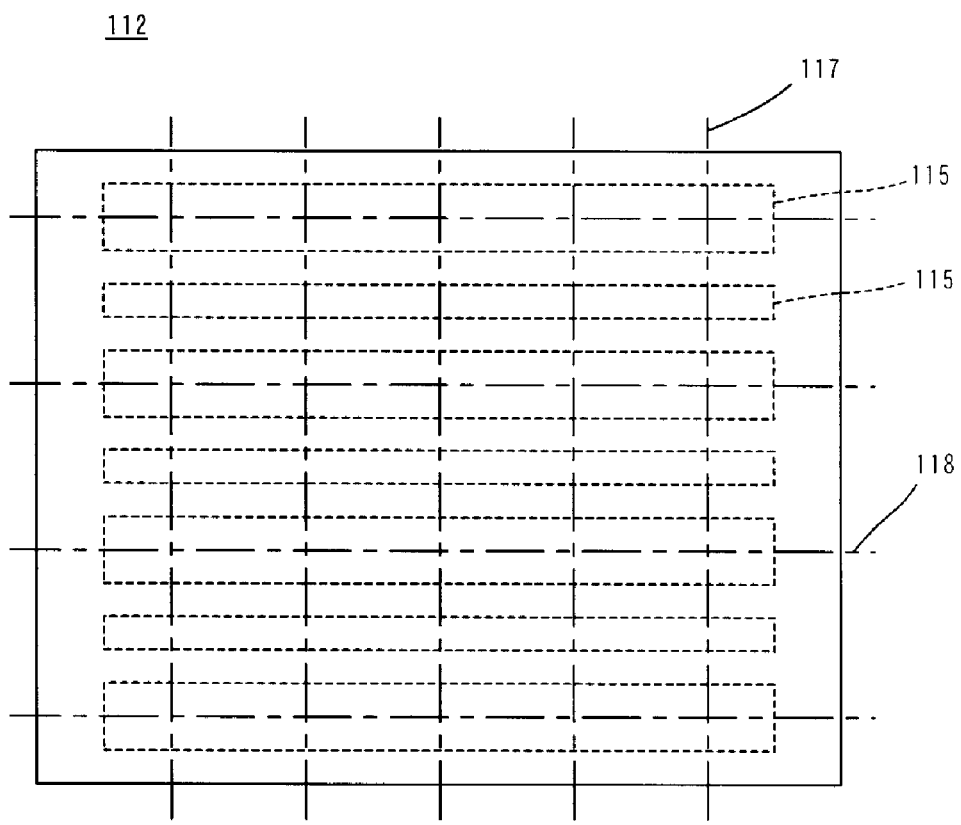
FIG. 13 is a plan view of a mother composite 112 prepared for manufacturing the multilayer ceramic substrate 111 shown in FIGS. 11 and 12.

FIG. 11 is a sectional view of a multilayer ceramic substrate 111 prepared as a sample in Experimental Example 1. In FIG. 11, the thickness of the multilayer ceramic substrate 111 is exaggerated. FIG. 12 is a plan view of a specific section of the multilayer ceramic substrate 111 shown in FIG. 11. FIG. 13 is a plan view of a mother composite 112 prepared for the multilayer ceramic substrate 111 shown in FIGS. 11 and 12.

As shown in FIGS. 11 and 12, the multilayer ceramic substrate 111 includes a multilayer composite 16 including first material layers 113 including an aggregate of a first powder including a glass material, second material layers 114 including an aggregate of a second powder including a ceramic material and disposed in contact with the first material layers 113, and an internal electrode 115 including an electroconductive material and disposed in contact with the first and second material layers 113 and 114.

In order to prepare this multilayer ceramic substrate 111, the following process was performed in Experimental Example 1.

A slurry was prepared for green sheets for the first material layers 113 by mixing 60 parts by weight of $SiO_2$—CaO—$Al_2O_3$—MgO—$B_2O_3$ glass powder with an average grain size of about 7 μm, 40 parts by weight of alumina powder with an average grain size of about 0.35 μm, 50 parts by weight of water as a dispersing medium, 20 parts by weight of polyvinyl alcohol as a binder, and 1 part by weight of polycarboxylic dispersant. After removing air from the slurry, the slurry was formed into sheets by the doctor blade method, followed by drying. Thus, about 30 μm thick green sheets were prepared.

Another slurry was prepared for green sheets for the second material layers 114 by mixing alumina powder with an average grain size of about 1 μm, 50 parts by weight of water as a dispersing medium, 20 parts by weight of polyvinyl alcohol as a binder, and 1 part by weight of polycarboxylic dispersant. After removing air from the slurry, the slurry was formed into sheets by the doctor blade method, followed by drying. Thus, about 7 μm thick green sheets were prepared.

The electroconductive paste for forming the internal electrode 115 included 48 parts by weight of Ag—Pd alloy powder with an average grain size of about 2 μm including 75 percent by weight of Ag and 25 percent by weight of Pd; 3 parts by weight of ethyl cellulose as a binder, and 49 parts by weight of tenpenes as a solvent.

As shown in Table 1, sample 1 used the electroconductive paste as it was, and for samples 2 to 7, alumina powder with an average grain size of about 0.4 μm was added to the electroconductive paste at the "alumina content" shown in Table 1. The "alumina content" is expressed as the percentage of the Ag—Pd alloy powder being the electroconductive material in the electroconductive paste on a volume basis.

Then, four green sheets for the first material layers 113 and five green sheets for the second material layers 114 were alternately stacked one on top of another so as to obtain the sectional structure shown in FIG. 11. In this instance, about a 4 μm green internal electrode 115 is formed of the electroconductive paste on the second material layer 114 to be disposed in the middle in the stacking direction.

Thus a green mother composite 112 was prepared as shown in FIG. 13. In FIG. 13, the internal electrodes 115 inside the mother composite 112 are indicated by dotted lines.

Then, the green mother composite 112 was fired at about 900° C. for about 20 minutes.

The fired mother composite 112 was subjected to a cutting step. In the cutting step, the mother composite 112 was cut along the lines of the cut surfaces 117 and 118 indicated by the dotted lines shown in FIG. 13 to expose the internal electrodes 115 at the cut surfaces 117 and 118. The cutting step was performed with a dicer using a blade of #600 metal bond type at a blade rotating speed of about 30,000 rpm and at a feeding speed of about 1.5 mm/s.

In the above cutting step, the intervals of the cut surfaces 117 were set to about 2 mm, and the intervals of the cut surfaces 118 were set about 2.5 mm. The internal electrodes 115 exposed at the cut surface 117 each had a width of about 0.5 mm.

The resulting multilayer ceramic substrate 111 was examined for cracks at the interfaces between the internal electrodes 115 exposed at the cut surfaces 117 and 118 and the first and second material layers 113 and 114. The results are shown in a column "crack" in Table 1.

The electrical continuity (presence or absence of a broken wire) of the internal electrode 115 in the multilayer ceramic substrate 111 was evaluated. The results are shown in a column "continuity of internal electrode" in Table 1.

The shrinkage of the internal electrode 115 in the firing step at about 900° C. was evaluated. The results are shown in a column "shrinkage of internal electrode" in Table 1.

TABLE 1

| Sample Number | Alumina content (vol %) | Crack | Continuity of internal electrode | Shrinkage of internal electrode (%) |
|---|---|---|---|---|
| 1 | 0 | Produced | Good | 27 |
| 2 | 10 | Produced | Good | 23 |
| 3 | 20 | Produced | Good | 19 |
| 4 | 30 | None | Good | 12 |
| 5 | 40 | None | Good | 6 |
| 6 | 50 | None | Good | 4 |
| 7 | 60 | None | No | 1 |

As shown in Table 1, Samples 4 to 7, each of which used an electroconductive paste including at least about 30% by volume of alumina powder, do not produce cracks. The internal electrodes 115 of these Samples 4 to 7 having no cracks exhibited shrinkages of less than about 19%, specifically about 12% or less. Thus, the shrinkage is reduced so that the residual stress is reduced to the extent that cracks are prevented in the cutting step.

When the alumina powder content was more than about 50% by volume, for example, about 60% by volume as with Sample 7, the electrical continuity of the internal electrode 115 was degraded, and the internal electrode 115 was broken.

2. EXPERIMENTAL EXAMPLE 2

Figure 14:
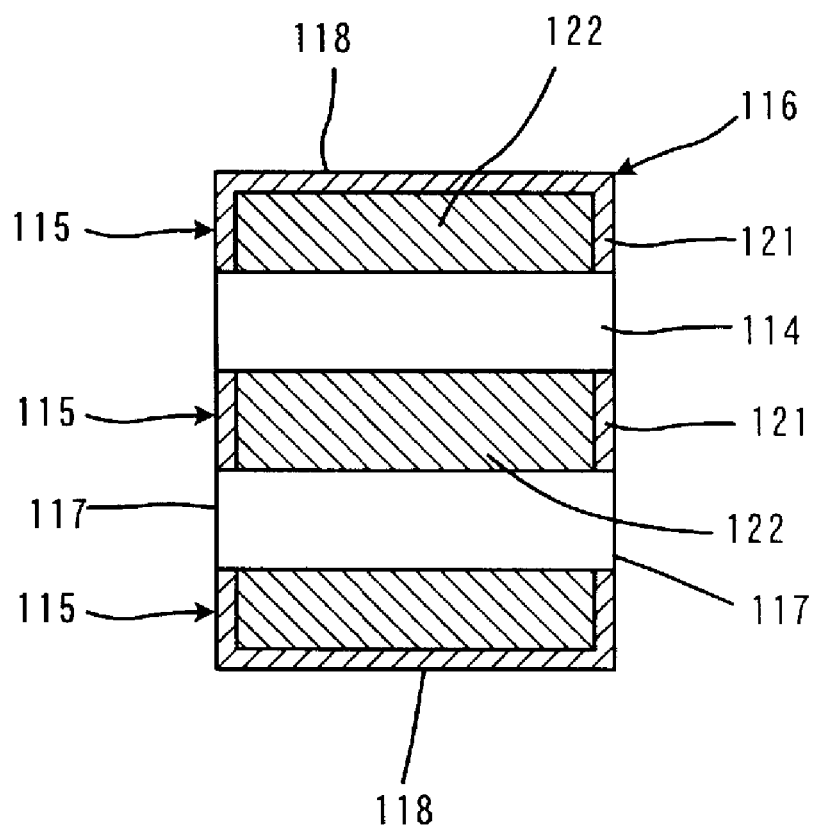
FIG. 14 is a plan view of the state where the internal electrodes 115 are disposed in the multilayer ceramic substrate 111a prepared as a sample in Experimental Example 2 performed to confirm the effects of the present invention.

While Experimental Example 1 used the electroconductive paste including alumina powder for the entire internal electrode 115, Experimental Example 2 provided alumina powder-containing regions 121 only in regions from the cut surfaces 117 and 118 to about 0.05 mm inside, and alumina free regions 122 in the other regions, as shown in FIG. 14. In FIG. 14, the portions corresponding to those shown in FIG. 12 are designated by the same reference numerals, and the description thereof is not repeated.

The resulting multilayer ceramic substrate 111a having the structure as shown in FIG. 14 was evaluated for cracks in the same manner as in Experimental Example 1, and the results were the same as in Experimental Example 1.

3. EXPERIMENTAL EXAMPLE 3

Experimental Example 1 used a Ag—Pd alloy including 75 percent by weight of Ag and 25 percent by weight of Pd as the electroconductive material included in the electroconductive paste for forming the internal electrode 115. As the Ag content is increased, the electroconductivity increases, but the shrinkage during firing increases and the internal electrode 115 is likely to break. In order to prevent broken electrodes, it is effective to increase the thickness of the internal electrode 115.

This was demonstrated by Experimental Example 3.

Specifically, multilayer ceramic substrates 111 of comparative examples corresponding to Samples 4 to 6 in Experimental Example 1, whose internal electrodes 115 had continuity, were prepared in the same manner as with Samples 4 to 6 in Experimental Example 1, except that a Ag—Pd alloy including 95 percent by weight of Ag and 10 percent by weight of Pd was used as the electroconductive material of the electroconductive paste. As a result, the internal electrode 115 was broken in each comparative example.

Accordingly, the electroconductive paste for forming the internal electrode 115 was applied with larger thicknesses of about 4 µm to about 6 µm. In each case, the internal electrode 115 had electrical continuity.

Then, an electroconductive paste including 100 weight of Ag as the electroconductive material was used in the same manner. When the electroconductive paste was applied at a thickness of about 10 µm, the internal electrodes 115 had electrical continuity in all the samples corresponding to Samples 4 to 6 in Experimental Example 1.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic substrate comprising:
   a multilayer composite including a first material layer including glass, a second material layer including a ceramic, disposed in contact with the first material layer, and an internal electrode including an electroconductive material, disposed in contact with at least one of the first material layer and the second material layer; wherein
   the first material layer is sintered, and is bonded to the second material layer such that a portion of the glass in the first material layer is diffused or permeated into the second material layer;
   the internal electrode includes a main portion and a lead-out portion extending from the main portion to a side surface of the multilayer composite, and the internal electrode includes a ceramic powder at least in the lead-out portion; and
   the main portion of the internal electrode does not include the ceramic powder, and the lead-out portion includes the ceramic powder.

2. The multilayer ceramic substrate according to claim 1, wherein the first material layer further includes the same ceramic as the ceramic of the ceramic powder included in the internal electrode.

3. The multilayer ceramic substrate according to claim 1, wherein the ceramic of ceramic powder included in the internal electrode is the same as the ceramic included in the second material layer.

4. The multilayer ceramic substrate according to claim 1, wherein a portion of the glass diffuses or permeates into the entirety of the second material layer.

5. The multilayer ceramic substrate according to claim 1, wherein at least a portion of the glass has a melting point less than the sintering temperature of the second material layer.

6. The multilayer ceramic substrate according to claim 1, wherein the ceramic powder content in the internal electrode is in the range of about 30% to about 50% by volume of the electroconductive material in the portion including the ceramic powder of the internal electrode.

7. The multilayer ceramic substrate according to claim 1, wherein the ceramic powder is included in the lead-out portion from the side surface of the multilayer composite to about 0.05 mm inside.

8. The multilayer ceramic substrate according to claim 1, wherein the internal electrode includes a main layer arranged so as to define the main portion, and a lead-out layer arranged so as to overlap with the main layer and to define the lead-out portion, and the main layer does not include the ceramic powder while the lead-out layer includes the ceramic powder.

9. The multilayer ceramic substrate according to claim 1, further comprising a second internal electrode arranged to oppose the internal electrode to define a capacitor.

10. A piezoelectric resonator component comprising a plate-like piezoelectric resonator element, and first and second exterior substrates separated in a vertical direction by the piezoelectric resonator element, wherein at least one of the first and second exterior substrates is the multilayer ceramic substrate as set forth in claim 1.

* * * * *